United States Patent
Cao et al.

(10) Patent No.: US 12,216,182 B2
(45) Date of Patent: Feb. 4, 2025

(54) DEVICE AND METHOD FOR DETECTING DEFECTS OF HIGH-VOLTAGE CABLE CROSS-BONDED GROUNDING SYSTEM

(71) Applicants: STATE GRID JIANGSU ELECTRIC POWER CO., LTD. RESEARCH INSTITUTE, Jiangsu (CN); STATE GRID JIANGSU ELECTRIC POWER CO., LTD., Jiangsu (CN); JIANGSU ELECTRIC POWER RESEARCH INSTITUTE CO., LTD., Jiangsu (CN)

(72) Inventors: Jingying Cao, Jiangsu (CN); Qiang Huang, Jiangsu (CN); Jinggang Yang, Jiangsu (CN); Jie Chen, Jiangsu (CN); Rong Sun, Jiangsu (CN); Jianjun Liu, Jiangsu (CN); Xiao Tan, Jiangsu (CN); Libin Hu, Jiangsu (CN); Chenying Li, Jiangsu (CN); Wei Zhang, Jiangsu (CN)

(73) Assignees: STATE GRID JIANGSU ELECTRIC POWER CO., LTD. RESEARCH INSTITUTE (CN); STATE GRID JIANGSU ELECTRIC POWER CO., LTD. (CN); JIANGSU ELECTRIC POWER RESEARCH INSTITUTE CO., LTD. (CN)

( * ) Notice: Subject to any disclaimer, the term of this patent is extended or adjusted under 35 U.S.C. 154(b) by 0 days.

(21) Appl. No.: 18/001,706

(22) PCT Filed: Aug. 4, 2022

(86) PCT No.: PCT/CN2022/110126
§ 371 (c)(1),
(2) Date: Dec. 13, 2022

(87) PCT Pub. No.: WO2023/077888
PCT Pub. Date: May 11, 2023

(65) Prior Publication Data
US 2024/0110997 A1 Apr. 4, 2024

(30) Foreign Application Priority Data
Nov. 2, 2021 (CN) .................. 202111286783.0

(51) Int. Cl.
*G01R 31/66* (2020.01)
*G01R 27/02* (2006.01)

(52) U.S. Cl.
CPC ............. *G01R 31/66* (2020.01); *G01R 27/02* (2013.01)

(58) Field of Classification Search
CPC .............. G01R 31/1272; G01R 31/083; G01R 31/085; G01R 27/02; G01R 31/081;
(Continued)

(56) References Cited

U.S. PATENT DOCUMENTS 9,413,156 B2 * 8/2016 O'Brien .................. H02H 3/02
10,598,705 B2 * 3/2020 Gaarder ............... G01R 21/133
(Continued)

*Primary Examiner* — Vinh P Nguyen

(57) ABSTRACT

Disclosed are a device and method for detecting defects of a high-voltage cable cross-bonded grounding system. The method selects a protective grounding box of a cross-bonded grounding system, respectively connects a signal excitation coupler to A-phase, B-phase and C-phase coaxial cables of the protective grounding box, selects a stable signal with a frequency different from a power frequency or a field interference frequency, and tests effective current values and phases responded by the A-phase, B-phase and C-phase coaxial cables when the stable signal with the frequency F1 is injected into the A-phase, B-phase and C-phase coaxial cables of the protective grounding box; and obtains resistances and inductances of branch circuits of the cable cross-bonded grounding system by calculation according to
(Continued)

measurement data, and determines if the cable cross-bonded grounding system has a connection defect.

7 Claims, 4 Drawing Sheets

(58) Field of Classification Search
CPC ........ G01R 31/52; G01R 31/08; G01R 31/00; G01R 31/086; G01R 19/165; G01R 19/25; G01R 31/11; G01R 15/18; G01R 23/02; G01R 27/08; G01R 27/16; G01R 31/58; G01R 31/66; Y04S 10/52; Y04S 40/18; H04B 3/46; H04B 3/54; H04W 4/02; H04W 4/38; H04W 4/80

See application file for complete search history.

(56) References Cited

U.S. PATENT DOCUMENTS

| | | | | |
|---|---|---|---|---|
| 11,029,367 | B2 * | 6/2021 | Li | G01R 31/52 |
| 11,493,546 | B2 * | 11/2022 | Hengl | G01R 1/0416 |
| 2010/0007354 | A1 * | 1/2010 | Deaver, Sr. | G01R 31/52 |
| | | | | 324/539 |

* cited by examiner

DEVICE AND METHOD FOR DETECTING DEFECTS OF HIGH-VOLTAGE CABLE CROSS-BONDED GROUNDING SYSTEM

FIELD OF THE INVENTION

The invention relates to a device and method for detecting defects of a high-voltage cable cross-bonded grounding system, and belongs to the technical field of power transmission and transformation equipment.

BACKGROUND OF THE INVENTION

At present, connection defects of a cable cross-bonded grounding system may cause floating discharge of metal in aluminum cable sheaths or cable accessories, leading to cable faults. The long cross-bonded segments of cables and the connection of metal cable sheaths in the cross-bonded segments with tall tubes of accessories and copper bars of grounding boxes make electrical connection complex. Traditional detection methods perform a test under the condition where lines are not in service and a cross-bonded grounding system is dismantled, thus being poor in timeliness and having limitations.

SUMMARY OF THE INVENTION

The objective of the invention to overcome the drawbacks in prior art. The invention provides a device and method for detecting defects of a high-voltage cable cross-bonded grounding system, which can detect the electrical connection state of the cable cross-bonded grounding system both in a power-on condition and in a power-off condition, and are easy and convenient to operate, and high in efficiency.

The technical solution adopted by the invention to fulfill the above objective is as follows:

The invention provides a device for detecting defects of a high-voltage cable cross-bonded grounding system, comprising: an AC power supply, a signal acquisition device, an input current test device, a signal excitation coupler, an output current test device, and test sensors, wherein:

The AC power supply is connected to the signal excitation coupler and is used for providing an alternating current with a frequency different from a power frequency and a field interference frequency for the signal excitation coupler;

The signal excitation coupler is installed on coaxial cables of a cross-bonded grounding lead and is used for injecting a stable current signal into a cable cross-bonded grounding system in a coupled manner;

The AC power supply is connected to the input current test device, and the input current test device is used for testing an effective value and phase of a current output by the AC power supply;

The output current test device is connected to the test sensors installed on the coaxial cables of the cross-bonded grounding lead, and is used for testing effective current values and phases responded by the coaxial cables of the cross-bonded grounding system at an excitation frequency;

The input current test device and the output current test device are both connected to the signal acquisition device, and the signal acquisition device is used for sampling current information output by the input current test device and the output current test device.

Further, the input current test device is an AC measurement device.

The invention further provides a method for detecting defects of a high-voltage cable cross-bonded grounding system, comprising:

Selecting, by means of an AC power supply, a stable current signal with a frequency F1 different from a power frequency and a field interference frequency;

Respectively injecting, by means of a signal excitation coupler, the stable current signal with the frequency F1 into A-phase, B-phase and C-phase coaxial cables of a protective grounding box of the cross-bonded grounding system in a coupled manner;

Under the condition where the stable current signal with the frequency F1 is injected into the A-phase, B-phase and C-phase coaxial cables in the coupled manner, testing, by means of an input current test device, an effective value and phase of a current output by the AC power supply, and testing, by means of an output current test device, effective current values and phases responded by the A-phase, B-phase and C-phase coaxial cables of the cross-bonded grounding system;

Calculating resistances of branch circuits of the cross-bonded grounding system based on test data; and Determining a defect of the high-voltage cable cross-bonded grounding system based on the calculated resistances.

Further, the effective value and phase of the current output by the AC power supply are tested by means of the input current test device, and an induced voltage of the cross-bonded grounding system is obtained by calculation according to the following formula:

$$U1i\angle \alpha i = k1*F1*Ii*[\cos \alpha i + j*\sin \alpha i] = Pi + j*Qi;$$

$$\alpha i = \beta i + \theta i;$$

Where, $U1i\angle \alpha i$ is the induced voltage of the cross-bonded grounding system in a phase $\alpha i$, $\alpha i$ is an induced phase, $Ii$ and $\beta i$ are the effective value and phase of the current output by the AC power supply, $Pi$ is a real part of a complex number $U1i$, $Qi$ is an imaginary part of the complex number $U1i$, $k1$ is a proportionality coefficient, $\theta i$ is a phase difference, and $i=1, 2, 3$ indicates an $i^{th}$ coupled injection;

$U1i$ and $\alpha i$ are obtained by calculation according to the test data, and then $Pi$ and $Qi$ are obtained.

Further, the effective current values and phases responded by the A-phase, B-phase and C-phase coaxial cables of the cross-bonded grounding system are tested by means of the output current test device, and currents and phases of leads in the coaxial cables are calculated as follows:

When the stable current signal with the frequency F1 is injected into the A-phase coaxial cable in a coupled manner, currents and phases of the leads in the coaxial cables are calculated by:

$$\begin{bmatrix} 1 & 1 & 0 \\ 1 & 0 & 1 \\ 0 & 1 & 1 \end{bmatrix}^{-1} \cdot \begin{bmatrix} IA\_1*\cos(\gamma A\_1) + j*IA\_1*\sin(\gamma A\_1) \\ IB\_1*\cos(\gamma B\_1) + j*IB\_1*\sin(\gamma B\_1) \\ IC\_1*\cos(\gamma C\_1) + j*IC\_1*\sin(\gamma C\_1) \end{bmatrix} =$$

$$\begin{bmatrix} IAB\_1*\cos(\gamma AB\_1) + j*IAB\_1*\sin(\gamma AB\_1) \\ IBC\_1*\cos(\gamma BC\_1) + j*IBC\_1*\sin(\gamma BC\_1) \\ ICA\_1*\cos(\gamma CA\_1) + j*IBC\_1*\sin(\gamma CA\_1) \end{bmatrix} = \begin{bmatrix} X11 + j*Y11 \\ X12 + j*Y12 \\ X13 + j*Y13 \end{bmatrix}$$

Where, IA_1, IB_1 and IC_1 are effective current values responded by the A-phase, B-phase and C-phase coaxial cables when the stable current signal with the frequency F1 is injected into the A-phase coaxial cable in the coupled manner, γA_1, γB_1 and γC_1 are current phases responded by the A-phase, B-phase and C-phase coaxial cables when the stable current signal with the frequency F1 is injected into the A-phase coaxial cable in the coupled manner, IAB_1, IBC_1 and ICA_1 are currents of a lead A1-B2, a lead B1-C2 and a lead C1-A3 in the coaxial cables when the stable current signal with the frequency F1 is injected into the A-phase coaxial cable in the coupled manner, γAB_1, γBC_1 and γCA_1 are current phases of the lead A1-B2, the lead B1-C2 and the lead C1-A3 in the coaxial cables when the stable current signal with the frequency F1 is injected into the A-phase coaxial cable in the coupled manner, X1j, j=1, 2, 3 is a real part of complex numbers IAB_1, IBC_1 and ICA_1, and Y1j is an imaginary part of the complex numbers IAB_1, IBC_1 and ICA_1;

When the stable current signal with the frequency F1 is injected into the B-phase coaxial cable in a coupled manner, currents and phases of the leads in the coaxial cables are calculated by:

$$\begin{bmatrix} 1 & 1 & 0 \\ 1 & 0 & 1 \\ 0 & 1 & 1 \end{bmatrix}^{-1} \cdot \begin{bmatrix} IA\_2 * \cos(\gamma A\_2) + j * IA\_2 * \sin(\gamma A\_2) \\ IB\_2 * \cos(\gamma B\_2) + j * IB\_2 * \sin(\gamma B\_2) \\ IC\_2 * \cos(\gamma C\_2) + j * IC\_2 * \sin(\gamma C\_2) \end{bmatrix} =$$

$$\begin{bmatrix} IAB\_2 * \cos(\gamma AB\_2) + j * IAB\_2 * \sin(\gamma AB\_2) \\ IBC\_2 * \cos(\gamma BC\_2) + j * IBC\_2 * \sin(\gamma BC\_2) \\ ICA\_2 * \cos(\gamma CA\_2) + j * IBC\_2 * \sin(\gamma CA\_2) \end{bmatrix} = \begin{bmatrix} X21 + j * Y21 \\ X22 + j * Y22 \\ X23 + j * Y23 \end{bmatrix};$$

Where, IA_2, IB_2 and IC_2 are effective current values responded by the A-phase, B-phase and C-phase coaxial cables when the stable current signal with the frequency F1 is injected into the B-phase coaxial cable in the coupled manner, γA_2, γB_2 and γC_2 are current phases responded by the A-phase, B-phase and C-phase coaxial cables when the stable current signal with the frequency F1 is injected into the B-phase coaxial cable in the coupled manner, IAB_2, IBC_2 and ICA_2 are currents of the lead A1-B2, the lead B1-C2 and the lead C1-A3 In the coaxial cables when the stable current signal with the frequency F1 is injected into the B-phase coaxial cable in the coupled manner, γAB_2, γBC_2 and γCA_2 are current phases of the lead A1-B2, the lead B1-C2 and the lead C1-A3 in the coaxial cables when the stable current signal with the frequency F1 is injected into the B-phase coaxial cable in the coupled manner, X2j, j=1, 2, 3 is a real part of complex numbers IAB_2, IBC_2 and ICA_2, and Y2j is an imaginary part of the complex numbers IAB_2, IBC_2 and ICA_2;

When the stable current signal with the frequency F1 is injected into the C-phase coaxial cable in a coupled manner, currents and phases of the leads in the coaxial cables are calculated by:

$$\begin{bmatrix} 1 & 1 & 0 \\ 1 & 0 & 1 \\ 0 & 1 & 1 \end{bmatrix}^{-1} \cdot \begin{bmatrix} IA\_3 * \cos(\gamma A\_3) + j * IA\_3 * \sin(\gamma A\_3) \\ IB\_3 * \cos(\gamma B\_3) + j * IB\_3 * \sin(\gamma B\_3) \\ IC\_3 * \cos(\gamma C\_3) + j * IC\_3 * \sin(\gamma C\_3) \end{bmatrix} =$$

$$\begin{bmatrix} IAB\_3 * \cos(\gamma AB\_3) + j * IAB\_3 * \sin(\gamma AB\_3) = X31 + j * Y31 \\ IBC\_3 * \cos(\gamma BC\_3) + j * IBC\_3 * \sin(\gamma BC\_3) = X32 + j * Y32 \\ ICA\_3 * \cos(\gamma CA\_3) + j * IBC\_3 * \sin(\gamma CA\_3) = X33 + j * Y33 \end{bmatrix} =$$

$$\begin{bmatrix} X31 + j * Y31 \\ X32 + j * Y32 \\ X33 + j * Y33 \end{bmatrix};$$

Where, IA_3, IB_3 and IC_3 are effective current values responded by the A-phase, B-phase and C-phase coaxial cables when the stable current signal with the frequency F1 is injected into the C-phase coaxial cable in the coupled manner, γA_3, γB_3 and γC_3 are current phases responded by the A-phase, B-phase and C-phase coaxial cables when the stable current signal with the frequency F1 is injected into the C-phase coaxial cable in the coupled manner, IAB_3, IBC_3 and ICA_3 are currents of the lead A1-B2, the lead B1-C2 and the lead C1-A3 In the coaxial cables when the stable current signal with the frequency F1 is injected into the C-phase coaxial cable in the coupled manner, γAB_3, γBC_3 and γCA_3 are current phases of the lead A1-B2, the lead B1-C2 and the lead C1-A3 in the coaxial cables when the stable current signal with the frequency F1 is injected into the C-phase coaxial cable in the coupled manner, X3j, j=1, 2, 3 is a real part of complex numbers IAB_3, IBC_3 and ICA_3, and Y3j is an imaginary part of the complex numbers IAB_3, IBC_3 and ICA_3;

Further, the resistances of the branch circuits of the cross-bonded grounding system are calculated by:

$$\begin{bmatrix} X11 & -X12 & 0 & -Y11 & Y12 & 0 \\ Y11 & -Y12 & 0 & X11 & -X12 & 0 \\ X21 & 0 & -X23 & -Y21 & 0 & Y23 \\ Y21 & 0 & -Y23 & X21 & 0 & -X23 \\ 0 & X32 & -X33 & 0 & -Y32 & Y33 \\ 0 & Y32 & -Y33 & 0 & X32 & -X33 \end{bmatrix} \cdot \begin{bmatrix} R1 \\ R2 \\ R3 \\ X1 \\ X2 \\ X3 \end{bmatrix} = \begin{bmatrix} P1 \\ Q1 \\ P2 \\ Q2 \\ P3 \\ Q3 \end{bmatrix};$$

Where, R1, R2 and R3 are resistances of a branch circuit A1-B2-C3, a branch circuit B1-C2-A3 and a branch circuit C1-A2-B3 of the cross-bonded grounding system respectively, and X1, X2 and X3 are inductances of the branch circuit A1-B2-C3, the branch circuit B1-C2-A3 and the branch circuit C1-A2-B3 of the cross-bonded grounding system respectively.

Further, if any one of the following two conditions is met, it is determined that the high-voltage cable cross-bonded grounding system has a defect:

A, the resistance of at least one of the branch circuits of the cable cross-bonded grounding system is greater than or equal to 0.30;

B, a ratio of the resistances of every two of the branch circuits of the cable cross-bonded grounding system is over 1.2.

The invention has the following beneficial effects:

According to the invention, a certain protective grounding box of a cross-bonded grounding system is selected, a stable signal with a frequency F1 different from the power frequency or the field interference frequency is injected into the cross-bonded grounding system in a coupled manner by means of a signal excitation coupler; based on effective current values and phases responded by A-phase, B-phase and C-phase coaxial cables and an input effective current value and phase simultaneous equation, resistances and inductances of branch circuits of the cable cross-bonded grounding system are obtained by calculation; when the resistance of any one of the branch circuits of the cable cross-bonded grounding system is greater than or equal to 0.3Ω or the ratio of the resistances of every two of the branch circuits is over 1.2, it is determined that the cable cross-bonded grounding system has a connection defect. The method and device provided by the invention are easy and convenient to operate and high in efficiency, fill in a blank in this technical field, and have good application prospects.

DETAILED DESCRIPTION OF THE INVENTION

The invention is further described below. The following embodiments are merely used to more clearly explain the technical solutions of the invention, and should not be construed as limitations of the protection scope of the invention.

Figure 1:
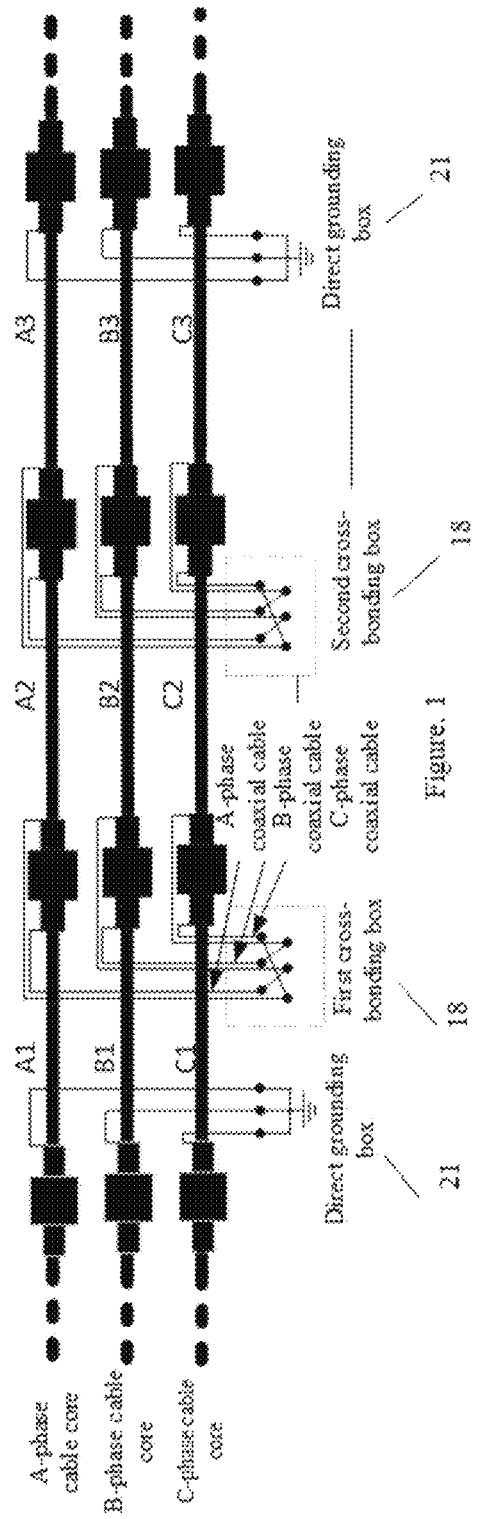
FIG. 1 is a schematic diagram of a cable cross-bonded grounding system.

Cables are grounded in a cross-transposed manner, transposed segments A1-B2-C3, A2-B3-C1 and A3-B1-C2 are connected, and coaxial cables A, B and C are disposed in grounding boxes 21, as shown in FIG. 1.

Figure 2:
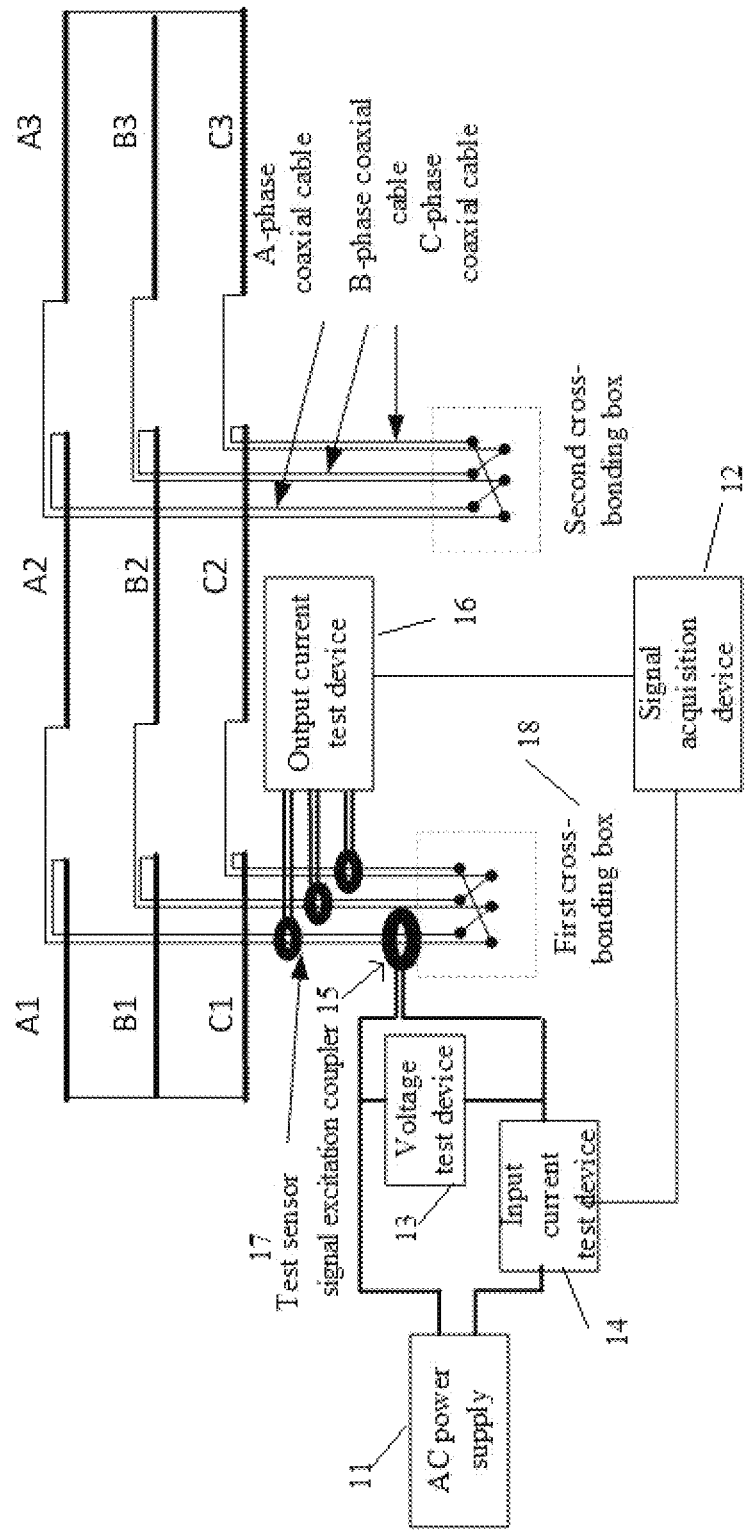
FIG. 2 is a structural diagram of a device for detecting defects of a high-voltage cable cross-bonded grounding system according to one embodiment of the invention.

One embodiment of the invention provides a device for detecting defects of a high-voltage cable cross-bonded grounding system which, as shown in FIG. 2, comprises an AC power supply 11, a signal acquisition device 12, a voltage test device 13, an input current test device 14, a signal excitation coupler 15, an output current test device 16 and test sensors 17.

Specifically, the AC power supply is connected to the signal excitation coupler and provides an alternating current at a frequency different from a power frequency and a field interfering frequency for the signal excitation coupler;

The AC power supply is also connected to the input current test device, and the input current test device is used for testing an effective value and phase of the current output by the AC power supply;

The signal excitation coupler is installed on coaxial cables of a cross-bonded grounding lead, and injects a stable signal into the cable cross-bonded grounding system through electromagnetic induction;

The output current test device is connected to the test sensors installed on the coaxial cables of the cross-bonded grounding lead, and is used for testing effective current values and phases of the coaxial cables of the cross-bonded grounding system at an excitation frequency through the test sensors;

The input current test device and the output current test device are both connected to the signal acquisition device, and the signal acquisition device is used for sampling and comparing phases of a current input by the AC power supply and a coupling induced current of the cross-bonded grounding system.

The voltage test device is used for observing a voltage injected into a coupling coil.

Preferably, a signal output by the AC power supply is an AC signal and has an adjustable frequency.

Preferably, the input current test device is an AC measurement device and is able to test effective current values and phases at different frequencies.

Preferably, the output current test device is able to test effective current values and phases at different frequencies through the test sensors.

Another embodiment of the invention provides a method for detecting defects of a high-voltage cable cross-bonded grounding system, comprising:

A stable current signal with a frequency F1 different from a power frequency and field interference frequency is selected by means of an AC power supply;

The stable current signal with the frequency F1 is injected into A-phase, B-phase and C-phase coaxial cables of a protective grounding box of the cross-bonded grounding system in a coupled manner by means of a signal excitation coupler;

Under the condition where the stable current signal with the frequency F1 is injected into the A-phase, B-phase and C-phase coaxial cables in the coupled manner, an effective value and phase of a current output by the AC power supply are tested testing an input current test device, and effective current values and phases responded by the A-phase, B-phase and C-phase coaxial cables of the cross-bonded grounding system are tested by means of an output current test device;

Resistances of branch circuits of the cross-bonded grounding system are calculated according to test data; and A defect of the high-voltage cable cross-bonded grounding system is determined based on the calculated resistances.

Preferably, the method for detecting defects of a high-voltage cable cross-bonded grounding system specifically comprises the following steps:

(1) One protective grounding box of the cross-bonded grounding system is selected, the signal excitation coupler is respectively connected to the A-phase, B-phase and C-phase coaxial cables of the protective grounding box which is cross-bonding box 18 (First cross-bonding box or second cross-bonding box of the cable cross-bonded grounding system, shown in FIG. 2), the stable current signal with the frequency F1 different from the power frequency and the field interference frequency is selected by means of the AC power supply, and is injected into the cross-bonded grounding system in a coupled manner, an effective value Ii and phase βi of a current output by the AC power supply are tested by means of the input current test device, and assume an effective value and phase of an induced current of the cross-bonded grounding system are U1i and αi:

$$U1i\angle\alpha i=k1*F1*Ii*[\cos\alpha i+j*\sin\alpha i]=Pi+j*Qi;$$

$$\alpha i=\beta i+\theta i;$$

U1i and αi are obtained by calculation based on test results, and then Pi and Qi are obtained.

Where, the unit of Ii is A, the unit of U1i is mV, the unit of αi and βi is degree, Pi is a real part of a complex number U1i, Qi is an imaginary part of the complex number U1i, k1 is a proportionality coefficient, is set manually during coupling injection, and is dimensionless, θi is a phase difference, and i=1, 2, 3 indicates an $i^{th}$ coupled injection for measurement.

(2) Effective current values and phases responded by the A-phase, B-phase and C-phase coaxial cables when the stable current signal with the frequency F1 is injected into the A-phase, B-phase and C-phase coaxial cables in the protective grounding box in the coupled manner by the signal excitation coupler are tested by means of the output current test device; assume the positive direction of a tested current is a side direction of the nearest grounding box, currents and phases of leads in the coaxial cables are calculated, specifically:

When the stable current signal with the frequency F1 is injected into the A-phase coaxial cable in a coupled manner, an effective current value of the A-phase coaxial cable is IA_1, and a phase of the A-phase coaxial cable is γA_1; an effective current value of the B-phase coaxial cable is IB_1, and a phase of the B-phase coaxial cable is γB_1; an effective current value of the C-phase coaxial cable is IC_1, and a phase of the C-phase coaxial cable is γC_1;

Assume the current of a lead A1-B2 in the coaxial cables is IAB_1, the phase of the lead A1-B2 is γAB_1, the current of a lead B1-C2 is IBC_1, the phase of the lead B1-C2 is γBC_1, the current of a lead C1-A3 is ICA_1 and the phase of the lead C1-A3 is γCA_1, the following relationship is obtained:

$$\begin{bmatrix} 1 & 1 & 0 \\ 1 & 0 & 1 \\ 0 & 1 & 1 \end{bmatrix}^{-1} \cdot \begin{bmatrix} IA\_1*\cos(\gamma A\_1) + j*IA\_1*\sin(\gamma A\_1) \\ IB\_1*\cos(\gamma B\_1) + j*IB\_1*\sin(\gamma B\_1) \\ IC\_1*\cos(\gamma C\_1) + j*IC\_1*\sin(\gamma C\_1) \end{bmatrix} =$$

$$\begin{bmatrix} IAB\_1*\cos(\gamma AB\_1) + j*IAB\_1*\sin(\gamma AB\_1) \\ IBC\_1*\cos(\gamma BC\_1) + j*IBC\_1*\sin(\gamma BC\_1) \\ ICA\_1*\cos(\gamma CA\_1) + j*IBC\_1*\sin(\gamma CA\_1) \end{bmatrix} = \begin{bmatrix} X11 + j*Y11 \\ X12 + j*Y12 \\ X13 + j*Y13 \end{bmatrix};$$

Where, the unit of IA_1, IB_1, IC_1, IAB_1, IBC_1 and ICA_1 is A, and the unit of γA_1, γB_1 and γC_1 is degree; X1j, j=1, 2, 3 is a real part of complex numbers IAB_1, IBC_1 and ICA_1, and Y1j, j=1, 2, 3 is an imaginary part of the complex numbers IAB_1, IBC_1 and ICA_1.

Based on the above relationship and test data, the current IAB_1 and phase γAB_1 of the lead A1-B2 in the coaxial cables, the current IBC_1 and phase γBC_1 of the lead B1-C2 in the coaxial cables, and the current ICA_1 and phase γCA_1 of the lead C1-A3 in the coaxial cables are solved when the stable signal with the frequency F1 is injected into the A-phase coaxial cable in the coupled manner, and then X1j and Y1j are obtained.

Similarly, when the stable signal with the frequency F1 is injected into the B-phase coaxial cable in a coupled manner, an effective current value of the A-phase coaxial cable is IA_2, and a phase of the A-phase coaxial cable is γA_2; an effective current value of the B-phase coaxial cable is IB_2, and a phase of the B-phase coaxial cable is γB_2; an effective current value of the C-phase coaxial cable is IC_2, and a phase of the C-phase coaxial cable is γC_2;

Assume the current of the lead A1-B2 in the coaxial cables is IAB_2, the phase of the lead A1-B2 is γAB_2, the current of the lead B1-C2 is IBC_2, the phase of the lead B1-C2 is γBC_2, the current of the lead C1-A2 is ICA_2, the phase of the lead C1-A2 is γCA_2, the following relationship is obtained:

$$\begin{bmatrix} 1 & 1 & 0 \\ 1 & 0 & 1 \\ 0 & 1 & 1 \end{bmatrix}^{-1} \cdot \begin{bmatrix} IA\_2*\cos(\gamma A\_2) + j*IA\_2*\sin(\gamma A\_2) \\ IB\_2*\cos(\gamma B\_2) + j*IB\_2*\sin(\gamma B\_2) \\ IC\_2*\cos(\gamma C\_2) + j*IC\_2*\sin(\gamma C\_2) \end{bmatrix} =$$

-continued $$\begin{bmatrix} IAB\_2*\cos(\gamma AB\_2) + j*IAB\_2*\sin(\gamma AB\_2) \\ IBC\_2*\cos(\gamma BC\_2) + j*IBC\_2*\sin(\gamma BC\_2) \\ ICA\_2*\cos(\gamma CA\_2) + j*IBC\_2*\sin(\gamma CA\_2) \end{bmatrix} = \begin{bmatrix} X21 + j*Y21 \\ X22 + j*Y22 \\ X23 + j*Y23 \end{bmatrix};$$

Where, the unit of IA_2, IB_2, IC_2, IAB_2, IBC_2 and ICA_2 is A, and the unit of γA_2, γB_2 and γC_2 is degree; X2j, j=1, 2, 3 is a real part of complex numbers IAB_2, IBC_2 and ICA_2, and Y2j, j=1, 2, 3 is an imaginary part of the complex numbers IAB_2, IBC_2 and ICA_2.

Based on the above relationship and test data, the current IAB_2 and phase γAB_2 of the lead A1-B2 in the coaxial cables, the current IBC_2 and phase γBC_2 of the lead B1-C2 in the coaxial cables, and the current ICA_2 and phase γCA_2 of the lead C1-A3 in the coaxial cables are solved when the stable signal with the frequency F1 is injected into the B-phase coaxial cable in the coupled manner, and then X2j and Y2j are obtained.

Similarly, when the stable signal with the frequency F1 is injected into the C-phase coaxial cable in a coupled manner, an effective current value of the A-phase coaxial cable is IA_3, and a phase of the A-phase coaxial cable is γA_3; an effective current value of the B-phase coaxial cable is IB_3, and a phase of the A-phase coaxial cable is γB_3; an effective current value of the C-phase coaxial cable is IC_3, and a phase of the C-phase coaxial cable is γC_3;

Assume the current of the lead A1-B3 in the coaxial cables is IAB_3, the phase of the lead A1-B2 is γAB_3, the current of the lead B1-C2 is IBC_3, the phase of the lead B1-C2 is γBC_3, the current of the lead C1-A3 is ICA_3, the phase of the lead C1-A3 is γCA_3, the following relationship is obtained:

$$\begin{bmatrix} 1 & 1 & 0 \\ 1 & 0 & 1 \\ 0 & 1 & 1 \end{bmatrix}^{-1} \cdot \begin{bmatrix} IA\_3*\cos(\gamma A\_3) + j*IA\_3*\sin(\gamma A\_3) \\ IB\_3*\cos(\gamma B\_3) + j*IB\_3*\sin(\gamma B\_3) \\ IC\_3*\cos(\gamma C\_3) + j*IC\_3*\sin(\gamma C\_3) \end{bmatrix} =$$

$$\begin{bmatrix} IAB\_3*\cos(\gamma AB\_3) + j*IAB\_3*\sin(\gamma AB\_3) = X31 + j*Y31 \\ IBC\_3*\cos(\gamma BC\_3) + j*IBC\_3*\sin(\gamma BC\_3) = X32 + j*Y32 \\ ICA\_3*\cos(\gamma CA\_3) + j*IBC\_3*\sin(\gamma CA\_3) = X33 + j*Y33 \end{bmatrix} =$$

$$\begin{bmatrix} X31 + j*Y31 \\ X32 + j*Y32 \\ X33 + j*Y33 \end{bmatrix};$$

Where, the unit of IA_3, IB_3, IC_3, IAB_3, IBC_3 and ICA_3 is A, and the unit of γA_3, γB_3 and γC_3 is degree; X3j, j=1, 2, 3 is a real part of complex numbers IAB_3, IBC_3 and ICA_3, and Y3j, j=1, 2, 3 is an imaginary part of the complex numbers IAB_3, IBC_3 and ICA_3.

Based on the above relationship and test data, the current IAB_3 and phase γAB_3 of the lead A1-B2 in the coaxial cables, the current IBC_3 and phase γBC_3 of the lead B1-C2 in the coaxial cables, and the current ICA_3 and phase γCA_3 of the lead C1-A3 in the coaxial cables are solved when the stable signal with the frequency F1 is injected into the C-phase coaxial cable in the coupled manner, and then X3j and Y3j are obtained.

Those skilled in the art should know that, during a field test, the coaxial cables are fixed, and excitation coupler and the test sensors can be opened or closed and can clamp the coaxial cables like clamps to inject and test currents.

(3) Resistances and inductances of branch circuits of the cable cross-bonded grounding system are obtained by calculation according to a simultaneous equation for electromagnetic induction cable and ohm cable assemblies, specifically:

$$\begin{bmatrix} X11 & -X12 & 0 & -Y11 & Y12 & 0 \\ Y11 & -Y12 & 0 & X11 & -X12 & 0 \\ X21 & 0 & -X23 & -Y21 & 0 & Y23 \\ Y21 & 0 & -Y23 & X21 & 0 & -X23 \\ 0 & X32 & -X33 & 0 & -Y32 & Y33 \\ 0 & Y32 & -Y33 & 0 & X32 & -X33 \end{bmatrix} \cdot \begin{bmatrix} R1 \\ R2 \\ R3 \\ X1 \\ X2 \\ X3 \end{bmatrix} = \begin{bmatrix} P1 \\ Q1 \\ P2 \\ Q2 \\ P3 \\ Q3 \end{bmatrix};$$

$$\begin{bmatrix} R1 \\ R2 \\ R3 \\ X1 \\ X2 \\ X3 \end{bmatrix} = \begin{bmatrix} X11 & -X12 & 0 & -Y11 & Y12 & 0 \\ Y11 & -Y12 & 0 & X11 & -X12 & 0 \\ X21 & 0 & -X23 & -Y21 & 0 & Y23 \\ Y21 & 0 & -Y23 & X21 & 0 & -X23 \\ 0 & X32 & -X33 & 0 & -Y32 & Y33 \\ 0 & Y32 & -Y33 & 0 & X32 & -X33 \end{bmatrix}^{-1} \cdot \begin{bmatrix} P1 \\ Q1 \\ P2 \\ Q2 \\ P3 \\ Q3 \end{bmatrix};$$

Where, ZA1-B2-C3=R1+jX1; ZB1-C2-A3=R2+jX2; ZC1-A2-B3=R3+jX3;

R1 is the resistance (unit: mΩ) of a branch circuit A1-B2-C3 of the cross-bonded grounding system, X1 is the inductive reactance (unit: mΩ) of the branch circuit A1-B2-C3 of the cross-bonded grounding system at the frequency F1, and ZA1-B2-C3 is the impedance of the branch circuit A1-B2-C3;

R2 is the resistance (unit: mΩ) of a branch circuit B1-C2-A3 of the cross-bonded grounding system, X2 is the inductive reactance (unit: mΩ) of the branch circuit B1-C2-A3 of the cross-bonded grounding system at the frequency F1, and ZB1-C2-A3 is the impedance of the branch circuit B1-C2-A3;

R3 is the resistance (unit: mΩ) of a branch circuit C1-A2-83 of the cross-bonded grounding system, X3 is the inductive reactance (unit: mΩ) of the branch circuit C1-A2-B3 of the cross-bonded grounding system at the frequency F1, and ZC1-A2-B3 is the impedance of the branch circuit C1-A2-13;

The inductances of the branch circuits are calculated by: L1=X1/(2*π*F1); L2=X2/(2*π*F1); L3=X2/(2*π*F1)

L1 is the inductance of the branch circuit A1-B2-C3 of the cross-bonded grounding system;

L2 is the inductance of the branch circuit B1-C2-A3 of the cross-bonded grounding system;

L3 is the inductance of the branch circuit C1-A2-B3 of the cross-bonded grounding system;

(4) When the resistance of any one of the branch circuits of the cable cross-bonded grounding system is greater than or equal to 0.3Ω, or a ratio of the resistances of every two of the branch circuits of the cable cross-bonded grounding system is over 1.2, it is determined that the cable cross-bonded grounding system has a connection defect.

Embodiment 1

Figure 3:
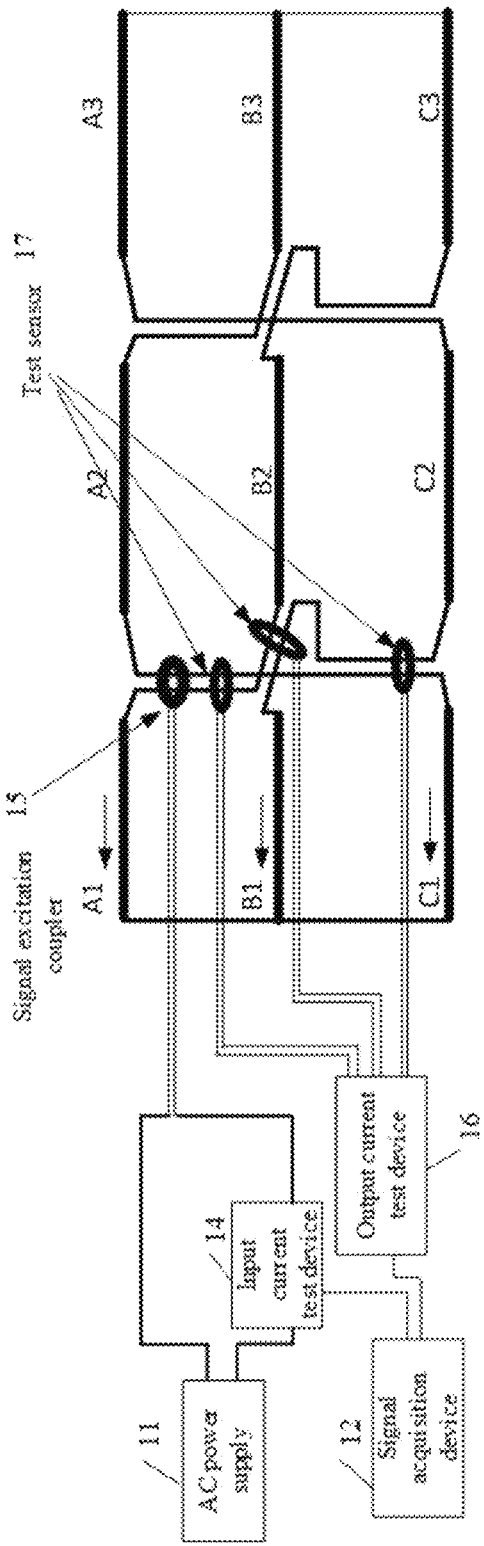
FIG. 3 is a test diagram of an A-phase coaxial cable of the cable cross-bonded grounding system according to one embodiment of the invention.

In this embodiment, a first protective grounding box of a cross-bonded grounding system is selected, as shown in FIG. 3, a signal excitation coupler is connected to an A-phase coaxial cable of the protective grounding box, a stable current signal with a frequency F1 different from a power frequency or a field interference frequency is selected by means of an AC power supply and is injected into the cross-bonded grounding system in a coupled manner, and effective current values and phases responded by A-phase, B-phase and the C-phase coaxial cables are tested by means of an output current test device. Similarly, the same protective grounding box is selected, the signal excitation coupler is connected to the B-phase coaxial cable and the C-phase coaxial cable of the protective grounding box respectively to test effective current values and phases responded by the A-phase, B-phase and C-phase coaxial cables. Currents and phases of leads in the coaxial cables are calculated based on test results.

Figure 4:
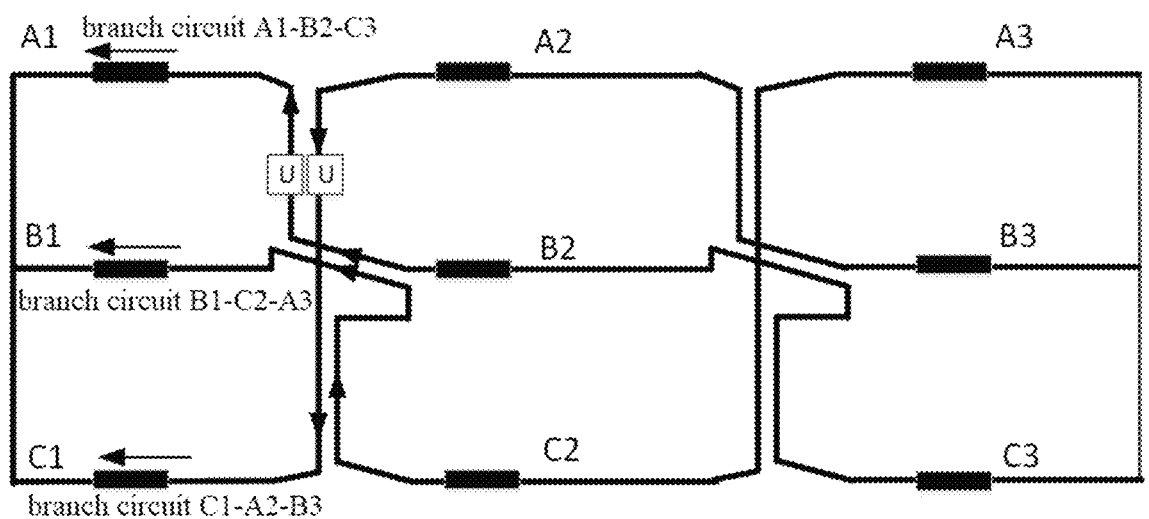
FIG. 4 is an equivalent circuit diagram for testing the A-phase coaxial cable according to one embodiment of the invention.

An equivalent circuit diagram for injecting an AC signal into the A-phase coaxial cable is shown in FIG. 4. Resistances and inductances of branch circuits of the cable cross-bonded grounding system are obtained by calculation according to a resistance, current and voltage simultaneous equation for electromagnetic induction cable and ohm cable assemblies. When the resistance of any one of the branch circuits of the cable cross-bonded grounding system is greater than or equal to 0.3Ω or the ratio of every two of the resistances of the branch circuits is over 1.2, it is determined that the cable cross-bonded grounding system has a connection defect. Operation is easy and convenient, the efficiency is high, the blank in this technical field is filled in, and the application prospect is good.

Embodiment 2

Assume the initial phase of a test current signal for the coaxial cables is 0 and the frequency of a current output by the AC power supply is 70 Hz, when the signal is injected into the A-phase coaxial cable of the first cross-bonding box A, test data of the A-phase, B-phase and C-phase coaxial cables is as follows:

I1=5A, β1=−173.7; IA_1=0.919, γA_1=0°; IB_1=1.712, γB_1=−139.99°; IC_1=1.168, γC_1=70.37*.

When the signal is injected into the B-phase coaxial cable of the first cross-bonding box A, test data of the A-phase, B-phase and C-phase coaxial cables is as follows:

I2=5A, β2=−173.77°; IA_2=0.931, γA_2=0°; IB_2=1.736, γB_2=−140.01*; IC_2=1.185, γC_2=70.32°.

When the signal is injected into the B-phase coaxial cable of the first cross-bonding box A, test data of the A-phase, B-phase and C-phase coaxial cables is as follows:

I3=5A, β3=−264.08; IA_3=0.001, γA_3=0°; IB_3=2.488, γB_3=−244.07°; IC_3=2.487, γC_3=−64.10°.

Induced voltage of the cross-bonded grounding system is calculated based on the above test data:

If k1=1.6, θ1=90, i=1, 2, 3.

So, α1=−83.70°; α2=−83.77°; α3=−174.08°.

$U1\angle\alpha1=1.6*70*I1*[\cos\alpha1+j*\sin\alpha1]=P1+j*Qi=242.631+j*(-2197.446)$ (mV);

$U2\angle\alpha2=1.6*70*I1*[\cos\alpha2+j*\sin\alpha2]=P2+j*Q2=243.032+j*(-2226.777)$ (mV);

$U3\angle\alpha3=1.6*70*I1*[\cos\alpha2+j*\sin\alpha2]=P3+j*Q3=-2199.025+j*(-227.870)$ (mV);

So: P1=242.631, Q1=−2197.446; P2=243.032, Q2=−2226.777; P3=−2199.025, Q3=−227.870.

Currents of coaxial cable cores are calculated:

$$\begin{bmatrix} 1 & 1 & 0 \\ 1 & 0 & 1 \\ 0 & 1 & 1 \end{bmatrix}^{-1} \cdot \begin{bmatrix} 0.919*\cos(0°)+j*0.919*\sin(0°) \\ 1.712*\cos(-139.99°)+j*1.712*\sin(-139.99°) \\ 1.168*\cos(70.37°)+j*1.168*\sin(70.37°) \end{bmatrix} =$$

-continued $$\begin{bmatrix} IAB\_1*\cos(\gamma AB\_1)+j*IAB\_1*\sin(\gamma AB\_1) \\ IBC\_1*\cos(\gamma BC\_1)+j*IBC\_1*\sin(\gamma BC\_1) \\ ICA\_1*\cos(\gamma CA\_1)+j*IBC\_1*\sin(\gamma CA\_1) \end{bmatrix} = \begin{bmatrix} X11+j*Y11 \\ X12+j*Y12 \\ X13+j*Y13 \end{bmatrix}$$

Where, X1j, j=1, 2, 3 is a real part of complex numbers IAB_1, IBC_1 and ICA_1; Y1j, j=1, 2, 3 is an imaginary part of the complex numbers IAB_1, IBC_1 and ICA_1.

By calculation, X11=−0.392, Y11=−1.100; X12=1.311, Y12=1.100; X13=−0.919, Y13=0.

Similarly, X21=−0.399, Y21=−1.116; X22=1.330, Y22=1.116; X23=−0.931, Y23=0; where, X2j, j=1, 2, 3 is a real part of complex numbers IAB_2, IBC_2 and ICA_2; Y1j, j=1, 2, 3 is an imaginary part of the complex numbers IAB_2, IBC_2 and ICA_2.

X31=−1.087, Y31=2.237; X32=1.088, Y32=−2.237; X33=−0.001, Y33=0; where, X2j, j=1, 2, 3 is a real part of complex numbers IAB_3, IBC_3 and ICA_3; Y1j, j=1, 2, 3 is an imaginary part of the complex numbers IAB_3, IBC_3 and ICA_3.

Finally, resistances and inductances of the branch circuits of cable cross-bonded grounding system are obtained by calculation according to the simultaneous equation for electromagnetic induction cable and ohm cable assemblies, specifically:

$$\begin{bmatrix} -0.392 & -1.311 & 0 & 1.100 & 1.100 & 0 \\ -1.100 & -1.100 & 0 & -0.392 & -1.311 & 0 \\ -0.399 & 0 & -1.330 & 1.116 & 0 & 1.116 \\ -1.116 & 0 & -1.116 & -0.399 & 0 & -1.330 \\ 0 & -1.087 & -1.088 & 0 & -2.237 & -2.237 \\ 0 & 2.237 & 2.237 & 0 & -1.087 & 1.088 \end{bmatrix} \cdot \begin{bmatrix} R1 \\ R2 \\ R3 \\ X1 \\ X2 \\ X3 \end{bmatrix} = \begin{bmatrix} 242.631 \\ -2197.446 \\ 243.032 \\ -2226.777 \\ -2199.025 \\ -227.870 \end{bmatrix}$$

$$\begin{bmatrix} R1 \\ R2 \\ R3 \\ X1 \\ X2 \\ X3 \end{bmatrix} = \begin{bmatrix} 1200 \\ 152 \\ 152 \\ 411.234 \\ 418.272 \\ 416.952 \end{bmatrix}$$

The inductances of the branch circuits are calculated:

$L1=X1/(2*\pi*F1)=411.234/(2*\pi*70)=0.935$ mH;

$L2=X2/(2*\pi*F1)=418.272/(2*\pi*70)=0.951$ mH;

$L3=X2/(2*\pi*F1)=416.952/(2*\pi*70)=0.948$ mH;

L1 is the inductance of the branch circuit A1-B2-C3 of the cross-bonded grounding system;

L2 is the inductance of the branch circuit B1-C2-A3 of the cross-bonded grounding system;

L3 is the inductance of the branch circuit C1-A2-B3 of the cross-bonded grounding system;

Because the resistance R1=1200 mΩ of the branch circuit A1-B2-C3 of the cross-bonded grounding system is greater than 300 mΩ, it is determined that the cross-bonded grounding system has a defect.

Those skilled in the art appreciate that the embodiments of the application can be provided as a method, a system or a computer program product. So, the embodiments of the application may be completely hardware embodiments, completely software embodiments, or embodiments combining software and hardware. In addition, the application may be in the form of a computer program product to be implemented on one or more computer-available storage media (including, but not limited to, a disk memory, a CD-ROM, an optical memory, and the like) comprising computer-available program codes.

The application is described with reference to the flow diagram and/or block diagram of the method, device (system) and computer program product provided by the embodiments of the application. It should be understood that each process and/or block in the flow diagram and/or block diagram and the combinations of processes and/or blocks in the flow diagram and/or block diagram can be implemented by computer program instructions. These computer program instructions can be configured in a processor of a general-purpose computer, a special-purpose computer, an embedded processor, or other programmable data processing devices to create a machine, so that the instructions can be executed by the computer or the processor of other programmable data processing device to create a device for realizing specific functions in one or more processes in the flow diagram and/or in one or more blocks in the block diagram.

These computer program instructions may also be stored in a computer-readable memory that can guide the computer or other program data processing devices to work in a specific manner, so that the instructions stored in the computer-readable memory can create a product including an instruction device, which implements specific functions in one or more processes of the flow diagram and/or one or more blocks in the block diagram.

These computer program instructions may also be loaded on a computer or other programmable data processing devices, so that the computer or other programmable devices can perform a series of operation steps to carry out processing realized by the computer, and the instructions are executed on the computer or other programmable devices to realize specific functions in one or more processes in the flow diagram and/or one or more block diagrams in the block diagram.

Finally, it should be noted that the above embodiments are merely used to explain the technical solutions of the invention rather than limiting the technical solutions of the invention. Although the invention has been described in detail with reference to the above embodiments, those ordinarily skilled in the art would appreciate that some modifications or equivalent substitutions may be made to the specific implementations of the invention, and any modifications or equivalent substitutions obtained without departing from the spirit and scope of the invention should still fall within the protection scope defined by the claims of the invention.

The invention claimed is:

1. A device for determining connection defects of a high-voltage cable cross-bonded grounding system, comprising: an AC power supply, a signal acquisition device, an input current test device, a signal excitation coupler, an output current test device, and test sensors, wherein:
  the AC power supply is connected to the signal excitation coupler and is used for providing an alternating current with a frequency different from a power frequency and a field interference frequency for the signal excitation coupler;

the signal excitation coupler is an annular closed loop installed on coaxial cables of a cross-bonded grounding lead which is connected to a cable cross-bonded grounding system, and is used for injecting a stable current signal into the cable cross-bonded grounding system based on the alternated current with the frequency different from the power frequency and the field interference frequency from the AC power supply;

the AC power supply is connected to the input current test device, and the input current test device is connected to the signal excitation coupler and is used for testing an effective value and phase of a current output by the AC power supply;

the output current test device is connected to the test sensors installed on the coaxial cables of the cross-bonded grounding lead which is connected to the cable cross-bonded grounding system, and is used for testing effective current values and phases responded by the coaxial cables of the cross-bonded grounding system at an excitation frequency, the input current test device and the output current test device are both connected to the signal acquisition device, and the signal acquisition device is used for sampling current information output by the input current test device and the output current test device.

2. The device for determining connection defects of a high-voltage cable cross-bonded grounding system according to claim 1, wherein, the input current test device is an AC measurement device.

3. A method for determining connection defects of a high-voltage cable cross-bonded grounding system by the device according to claim 1, comprising the following steps:

selecting, by means of the AC power supply, a stable current signal with a frequency F1 different from a power frequency and a field interference frequency;

respectively injecting, by means of the signal excitation coupler, the stable current signal with the frequency F1 into A-phase, B-phase and C-phase coaxial cables into a cross-bonding box of the cable cross-bonded grounding system;

under the condition where the stable current signal with the frequency F1 is injected into the A-phase, B-phase and C-phase coaxial cables, testing, by means of the input current test device, an effective value and phase of a current output by the AC power supply, and testing, by means of the output current test device, effective current values and phases responded by the A-phase, B-phase and C-phase coaxial cables of the cable cross-bonded grounding system, calculating resistances of branch circuits of the cable cross-bonded grounding system based on test data which include the effective value and phase of the current output by the AC power supply and the effective current values and phases responded by the A-phase, B-phase and C-phase coaxial cables of the cable cross-bonded grounding system; and determining the connection defect of the high-voltage cable cross-bonded grounding system based on the calculated resistances.

4. The method for determining connection defects of a high-voltage cable cross-bonded grounding system according to claim 3, wherein, the effective value and phase of the current output by the AC power supply are tested by means of the input current test device, and an induced voltage of the cable cross-bonded grounding system is obtained by calculation according to the following formula:

$$U1i\angle\alpha i = k1*F1*Ii*[\cos\alpha i + j*\sin\alpha i] = Pi + j*Qi;$$

$$\alpha i = \beta i + \theta i;$$

where, $U1i\angle\alpha i$ is the induced voltage of the cable cross-bonded grounding system in a phase $\alpha i$, $\alpha i$ is an induced phase, $Ii$ and $\beta i$ are the effective value and phase of the current output by the AC power supply, $Pi$ is a real part of a complex number $U1i$, $Qi$ is an imaginary part of the complex number $U1i$, $k1$ is a proportionality coefficient, $\theta i$ is a phase difference, and $i=1, 2, 3$ indicates an ith coupled injection;

$U1i$ and $\alpha i$ are obtained by calculation according to the test data, and then $Pi$ and $Qi$ are obtained.

5. The method for determining connection defects of a high-voltage cable cross-bonded grounding system according to claim 4, wherein, the effective current values and phases responded by the A-phase, B-phase and C-phase coaxial cables of the cable cross-bonded grounding system are tested by means of the output current test device, and currents and phases of leads in the coaxial cables are calculated as follows:

when the stable current signal with the frequency F1 is injected into the A-phase coaxial cable in a coupled manner, currents and phases of the leads in the coaxial cables are calculated by:

$$\begin{bmatrix} 1 & 1 & 0 \\ 1 & 0 & 1 \\ 0 & 1 & 1 \end{bmatrix}^{-1} \cdot \begin{bmatrix} IA\_1*\cos(\gamma A\_1) + j*IA\_1*\sin(\gamma A\_1) \\ IB\_1*\cos(\gamma B\_1) + j*IB\_1*\sin(\gamma B\_1) \\ IC\_1*\cos(\gamma C\_1) + j*IC\_1*\sin(\gamma C\_1) \end{bmatrix} =$$

$$\begin{bmatrix} IAB\_1*\cos(\gamma AB\_1) + j*IAB\_1*\sin(\gamma AB\_1) \\ IBC\_1*\cos(\gamma BC\_1) + j*IBC\_1*\sin(\gamma BC\_1) \\ ICA\_1*\cos(\gamma CA\_1) + j*IBC\_1*\sin(\gamma CA\_1) \end{bmatrix} = \begin{bmatrix} X11 + j*Y11 \\ X12 + j*Y12 \\ X13 + j*Y13 \end{bmatrix};$$

where, IA_1, IB_1 and IC_1 are effective current values responded by the A-phase, B-phase and C-phase coaxial cables when the stable current signal with the frequency F1 is injected into the A-phase coaxial cable in the coupled manner, γA_1, γB_1 and γC_1 are current phases responded by the A-phase, B-phase and C-phase coaxial cables when the stable current signal with the frequency F1 is injected into the A-phase coaxial cable in the coupled manner, IAB_1, IBC_1 and ICA 1 are currents of a lead A1-B2, a lead B1-C2 and a lead C1-A3 in the coaxial cables when the stable current signal with the frequency F1 is injected into the A-phase coaxial cable in the coupled manner, γAB_1, γBC_1 and γCA_1 are current phases of the lead A1-B2, the lead B1-C2 and the lead C1-A3 in the coaxial cables when the stable current signal with the frequency F1 is injected into the A-phase coaxial cable in the coupled manner, X1j, j=1, 2, 3 is a real part of complex numbers IAB_1, IBC_1 and ICA_1, and Y1j is an imaginary part of the complex numbers IAB_1, IBC_1 and ICA_1;

when the stable current signal with the frequency F1 is injected into the B-phase coaxial cable in a coupled manner, currents and phases of the leads in the coaxial cables are calculated by:

$$\begin{bmatrix} 1 & 1 & 0 \\ 1 & 0 & 1 \\ 0 & 1 & 1 \end{bmatrix}^{-1} \cdot \begin{bmatrix} IA\_2*\cos(\gamma A\_2) + j*IA\_2*\sin(\gamma A\_2) \\ IB\_2*\cos(\gamma B\_2) + j*IB\_2*\sin(\gamma B\_2) \\ IC\_2*\cos(\gamma C\_2) + j*IC\_2*\sin(\gamma C\_2) \end{bmatrix} =$$

-continued $$\begin{bmatrix} IAB\_2*\cos(\gamma AB\_2)+j*IAB\_2*\sin(\gamma AB\_2) \\ IBC\_2*\cos(\gamma BC\_2)+j*IBC\_2*\sin(\gamma BC\_2) \\ ICA\_2*\cos(\gamma CA\_2)+j*IBC\_2*\sin(\gamma CA\_2) \end{bmatrix} = \begin{bmatrix} X21+j*Y21 \\ X22+j*Y22 \\ X23+j*Y23 \end{bmatrix};$$

where, IA_2, IB_2 and IC_2 are effective current values responded by the A-phase, B-phase and C-phase coaxial cables when the stable current signal with the frequency F1 is injected into the B-phase coaxial cable in the coupled manner, γA_2, γB_2 and γC_2 are current phases responded by the A-phase, B-phase and C-phase coaxial cables when the stable current signal with the frequency F1 is injected into the B-phase coaxial cable in the coupled manner, IAB_2, IBC 2 and ICA 2 are currents of the lead A1-B2, the lead B1-C2 and the lead C1-A3 in the coaxial cables when the stable current signal with the frequency F1 is injected into the B-phase coaxial cable in the coupled manner, γAB_2, γBC_2 and γCA_2 are current phases of the lead A1-B2, the lead B1-C2 and the lead C1-A3 in the coaxial cables when the stable current signal with the frequency F1 is injected into the B-phase coaxial cable in the coupled manner, X2j, j=1, 2, 3 is a real part of complex numbers IAB_2, IBC_2 and ICA_2, and Y2j is an imaginary part of the complex numbers IAB_2, IBC_2 and ICA_2;

when the stable current signal with the frequency F1 is injected into the C-phase coaxial cable in a coupled manner, currents and phases of the leads in the coaxial cables are calculated by:

$$\begin{bmatrix} 1 & 1 & 0 \\ 1 & 0 & 1 \\ 0 & 1 & 1 \end{bmatrix}^{-1} \cdot \begin{bmatrix} IA\_3*\cos(\gamma A\_3)+j*IA\_3*\sin(\gamma A\_3) \\ IB\_3*\cos(\gamma B\_3)+j*IB\_3*\sin(\gamma B\_3) \\ IC\_3*\cos(\gamma C\_3)+j*IC\_3*\sin(\gamma C\_3) \end{bmatrix} =$$

$$\begin{bmatrix} IAB\_3*\cos(\gamma AB\_3)+j*IAB\_3*\sin(\gamma AB\_3)=X31+j*Y31 \\ IBC\_3*\cos(\gamma BC\_3)+j*IBC\_3*\sin(\gamma BC\_3)=X32+j*Y32 \\ ICA\_3*\cos(\gamma CA\_3)+j*IBC\_3*\sin(\gamma CA\_3)=X33+j*Y33 \end{bmatrix} =$$

$$\begin{bmatrix} X31+j*Y31 \\ X32+j*Y32 \\ X33+j*Y33 \end{bmatrix};$$

where, IA_3, IB_3 and IC_3 are effective current values responded by the A-phase, B-phase and C-phase coaxial cables when the stable current signal with the frequency F1 is injected into the C-phase coaxial cable in the coupled manner, γA_3, γB_3 and γC_3 are current phases responded by the A-phase, B-phase and C-phase coaxial cables when the stable current signal with the frequency F1 is injected into the C-phase coaxial cable in the coupled manner, IAB_3, IBC_3 and ICA 3 are currents of the lead A1-B2, the lead B1-C2 and the lead C1-A3 in the coaxial cables when the stable current signal with the frequency F1 is injected into the C-phase coaxial cable in the coupled manner, γAB_3, γBC_3 and γCA_3 are current phases of the lead A1-B2, the lead B1-C2 and the lead C1-A3 in the coaxial cables when the stable current signal with the frequency F1 is injected into the C-phase coaxial cable in the coupled manner, X3j, j=1, 2, 3 is a real part of complex numbers IAB_3, IBC_3 and ICA_3, and Y3j is an imaginary part of the complex numbers IAB 3, IBC_3 and ICA 3.

6. The method for determining connection defects of a high-voltage cable cross-bonded grounding system according to claim 5, wherein, the resistances of the branch circuits of the cable cross-bonded grounding system are calculated by:

$$\begin{bmatrix} X11 & -X12 & 0 & -Y11 & Y12 & 0 \\ Y11 & -Y12 & 0 & X11 & -X12 & 0 \\ X21 & 0 & -X23 & -Y21 & 0 & Y23 \\ Y21 & 0 & -Y23 & X21 & 0 & -X23 \\ 0 & X32 & -X33 & 0 & -Y32 & Y33 \\ 0 & Y32 & -Y33 & 0 & X32 & -X33 \end{bmatrix} \cdot \begin{bmatrix} R1 \\ R2 \\ R3 \\ X1 \\ X2 \\ X3 \end{bmatrix} = \begin{bmatrix} P1 \\ Q1 \\ P2 \\ Q2 \\ P3 \\ Q3 \end{bmatrix};$$

where, R1, R2 and R3 are resistances of a branch circuit A1-B2-C3, a branch circuit B1-C2-A3 and a branch circuit C1-A2-B3 of the cable cross-bonded grounding system respectively, and X1, X2 and X3 are inductances of the branch circuit A1-B2-C3, the branch circuit B1-C2-A3 and the branch circuit C1-A2-B3 of the cable cross-bonded grounding system respectively.

7. The method for determining connection defects of a high-voltage cable cross-bonded grounding system according to claim 6, wherein, if any one of the following two conditions is met, it is determined that the high-voltage cable cross-bonded grounding system has a defect:

A, the resistance of at least one of the branch circuits of the cable cross-bonded grounding system is greater than or equal to 0.3Ω;

B, a ratio of the resistances of every two of the branch circuits of the cable cross-bonded grounding system is over 1.2.

* * * * *